United States Patent [19]

Wardenier

[11] Patent Number: 5,272,437
[45] Date of Patent: Dec. 21, 1993

[54] RF COIL SYSTEM IN A MAGNETIC RESONANCE IMAGING APPARATUS

[75] Inventor: Peter H. Wardenier, Eindhoven, Netherlands

[73] Assignee: U.S. Philips Corporation, New York, N.Y.

[21] Appl. No.: 711,472

[22] Filed: Jun. 5, 1991

[30] Foreign Application Priority Data

Jun. 8, 1990 [NL] Netherlands ............ 9001298

[51] Int. Cl.⁵ ............................................. G01R 33/20
[52] U.S. Cl. ................................... 324/322; 324/318
[58] Field of Search ............. 324/300, 307, 308, 309, 324/310, 311, 312, 313, 314, 318, 322

[56] References Cited

U.S. PATENT DOCUMENTS

| | | | |
|---|---|---|---|
| 4,558,278 | 12/1985 | Young | 324/309 |
| 4,695,798 | 9/1987 | Brandes | 324/307 |
| 4,737,713 | 4/1988 | Danby et al. | 324/307 |
| 4,737,718 | 4/1988 | Kemner et al. | 324/322 |
| 4,825,162 | 4/1989 | Roemer et al. | 324/318 |
| 4,827,219 | 5/1989 | Harrison | 324/322 |
| 4,839,595 | 6/1989 | Boskamp | 324/318 |
| 4,859,947 | 8/1989 | Boskamp | 324/318 |
| 4,885,541 | 12/1989 | Hayes | 324/322 |
| 4,916,418 | 4/1990 | Rath | 333/219 |
| 4,943,775 | 6/1990 | Boskamp et al. | 324/322 |
| 4,947,121 | 8/1990 | Hayes | 324/322 |

FOREIGN PATENT DOCUMENTS 0112663 7/1984 European Pat. Off. .
0273484 7/1988 European Pat. Off. .
0412824 2/1991 European Pat. Off. .

*Primary Examiner*—Michael J. Tokar
*Attorney, Agent, or Firm*—Edward Blocker

[57] ABSTRACT

In a magnetic resonance imaging apparatus comprising an array consisting of several rf coil elements, a bandpass filter is coupled to corresponding individual coils of the array, the outputs of the bandpass filters being connected to form a signal summing device. As a result, a substantial part of the imaging is sequentially performed, so that the construction of the image processing device may be simpler and the risk of image artefacts is reduced. The array forms a linear series of surface coils, a common axis of which coincides with the measurement gradient field direction.

20 Claims, 2 Drawing Sheets

RF COIL SYSTEM IN A MAGNETIC RESONANCE IMAGING APPARATUS

FIELD OF THE INVENTION

The invention relates to a magnetic resonance imaging apparatus, comprising a magnet for generating a steady magnetic filed in a measuring space, a gradient coil system and an rf coil system consisting of several coil elements.

BACKGROUND OF THE INVENTION

A magnetic resonance imaging apparatus of this kind is known from WO 89/05115. In an apparatus described therein sub-images are formed from measurement signals of each of the coil elements of a surface coil system. Sub-images thus formed are subsequently combined so as to form an ultimate image of a region of an object to be examined by way of the rf surface coil system. A comparatively low-noise image can be formed of a region by means of such a measuring method. However, the method requires a comparatively complex signal processing device because simultaneous signal processing chains are required for all sub-images and sub-image integration must be performed pixel-by-pixel in order to prevent addition of noise.

SUMMARY OF THE INVENTION

It is an object of the invention to mitigate the described drawbacks; to achieve this, a magnetic resonance imaging apparatus in accordance with the invention comprises individual coil elements with a frequency bandpass filter adapted to a measurement frequency band of the relevant coil element.

Because a bandpass filter having an appropriate measurement frequency band is added to each relevant coil element in accordance with the invention, further signal processing can be combined to a high degree for the system of measuring coils. As a result, the necessary electronic circuit can be substantially simplified and the otherwise necessary pixel-by-pixel sub-image integration is avoided.

In a preferred embodiment, frequency bands of successive sub-coils are chosen to be consecutive, possibly with a small mutual overlap or spacing. Each of the bandpass filters, therefore, covers a frequency band of, for example from 1 to 20 kHz, for example for a chosen measurement gradient and main field. A practical embodiment of such a consecutive series can be realized, for example by means of a linear array of surface coils where a longitudinal direction of the array extends parallel to the gradient direction of a measurement gradient field to be generated in the measuring space of the apparatus.

Respective bandpass filters of coil elements in a preferred embodiment are connected to a single signal processing device for forming a combined signal to be sequentially processed. Between individual bandpass filters and coil elements coupled thereto a preamplifier is inserted in order to reduce added noise in a preferred embodiment. Such a preamplifier may also be included between the bandpass filters and the common signal processing device. In order to adapt the frequency band of the bandpass filters to the measurement frequency band of an associated coil element, the frequency of the bandpass filter may be adjustable. In that case the minimum frequency or central frequency or, the bandwidth of the frequency band can be adjustable or both. Conversely, it may be advantageous to utilize exactly adjusted fixed bandpass filters and a signal processing device optimally adapted thereto. For example, by choosing the strength of a measurement gradient field, the frequency bands of sub-coils may be adapted thereto.

For adaptation of bandpass filters in a preferred embodiment an input mixer and an output mixer are added. Both mixers are connected to an auxiliary oscillator in order to form a substantially fixed difference frequency for a varying input frequency. The auxiliary oscillator is adjustable notably by means of a control signal which is dependent on a main field strength in a measuring space.

In order to avoid mutual influencing of sub-coils they may be constructed so as to overlap one another as surface coils, for example as described in EP 273 484, or as butterfly coils, for example as described in EP 218 290.

BRIEF DESCRIPTION OF THE DRAWING

Some preferred embodiments in accordance with the invention will be described in detail hereinafter with reference to the drawing. Therein.

DESCRIPTION OF THE PREFERRED EMBODIMENTS

Figure 1:
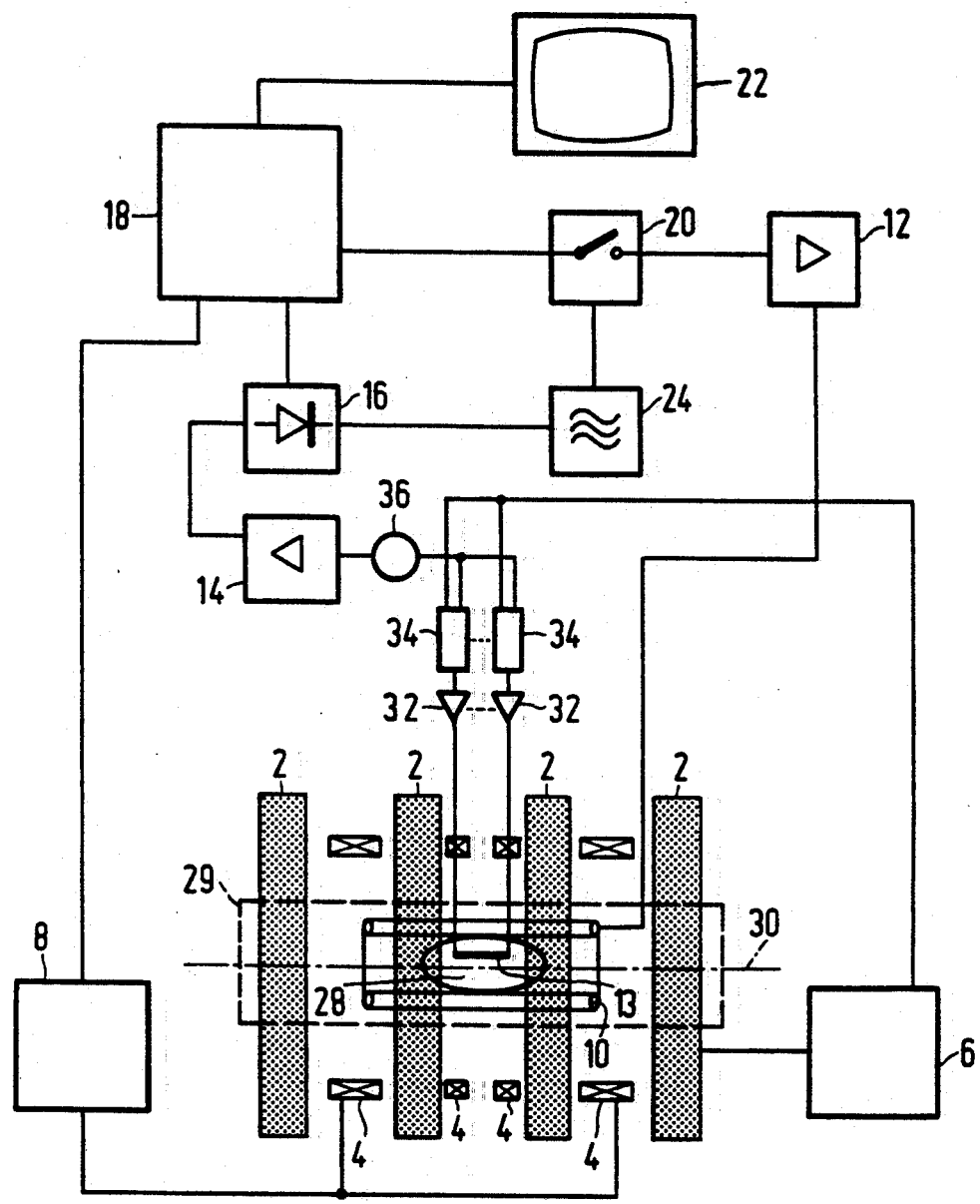
FIG. 1 shows a magnetic resonance imaging apparatus in accordance with an embodiment of the invention.

A magnetic resonance imaging apparatus as shown in FIG. 1 comprises a magnet system 2 for generating a steady, uniform magnetic field, a magnet system 4 for generating magnetic gradient fields, and control devices 6 and 8 for the magnet system 2 and the magnet system 4, respectively. A magnet coil 10 for generating an rf magnetic alternating field is connected to an rf source 12. Use is made of a coil system 13 for the detection of magnetic resonance signals generated by the rf transmitted field in an object to be examined. For reading purposes the coil system 13 is connected to a signal processing device 14. The signal processing device 14 is connected to a phase-sensitive rectifier 16 which is connected to a central control device 18. The central control device 18 also controls a modulator 20 for the rf source 12, the control device 8 for the gradient coils and a monitor 22 for image display. An rf oscillator 24 controls the modulator 20 as well as the phase-sensitive rectifier 16 which processes the measurement signals. The transmitter coil 10, being arranged within the magnet systems 2 and 4 and constructed, for example as a bird cage coil as described in EP 213 665, encloses a measuring space 28 which, in the case of a medical diagnostic apparatus, offers adequate space to accommodate patients. Thus, a steady magnetic field, gradient fields for position selection of slices to be imaged, and a spatially uniform rf alternating field can thus be generated in the measuring space 28. A steady magnetic field generated by the steady magnet system 2 is oriented in the axial direction in the present embodiment. The gradient magnet system in a magnetic resonance imaging apparatus customarily comprises a coil system for three coordinate directions, activation of the coil system producing gradient fields in each of the three directions so that a point-by-point image of an object can be formed.

In the described embodiment the measurement gradient fields are oriented, for example along the axial axis 30 and in two directions extending transversely thereof.

The coil system 13 of the present embodiment comprises a linear coil system 31 which includes a plurality of coils which are not separately shown and for which it is assumed for the sake of simplicity that a common axis thereof is directed parallel to an axis coincident with an axial axis 30 of a gradient field to be applied. Individual coils of the linear coil system are connected to a common summing device 36, via preamplifiers 32 and a bandpass filter 34.

On the basis of the series of coil signals of different frequency, the summing device forms a composite signal which is applied to the signal processing device 14 for sequential processing. The bandpass filters 34 are connected to the control device 6 of the main magnet system 2 for main field adaptation as will be described hereinafter.

Figure 2:
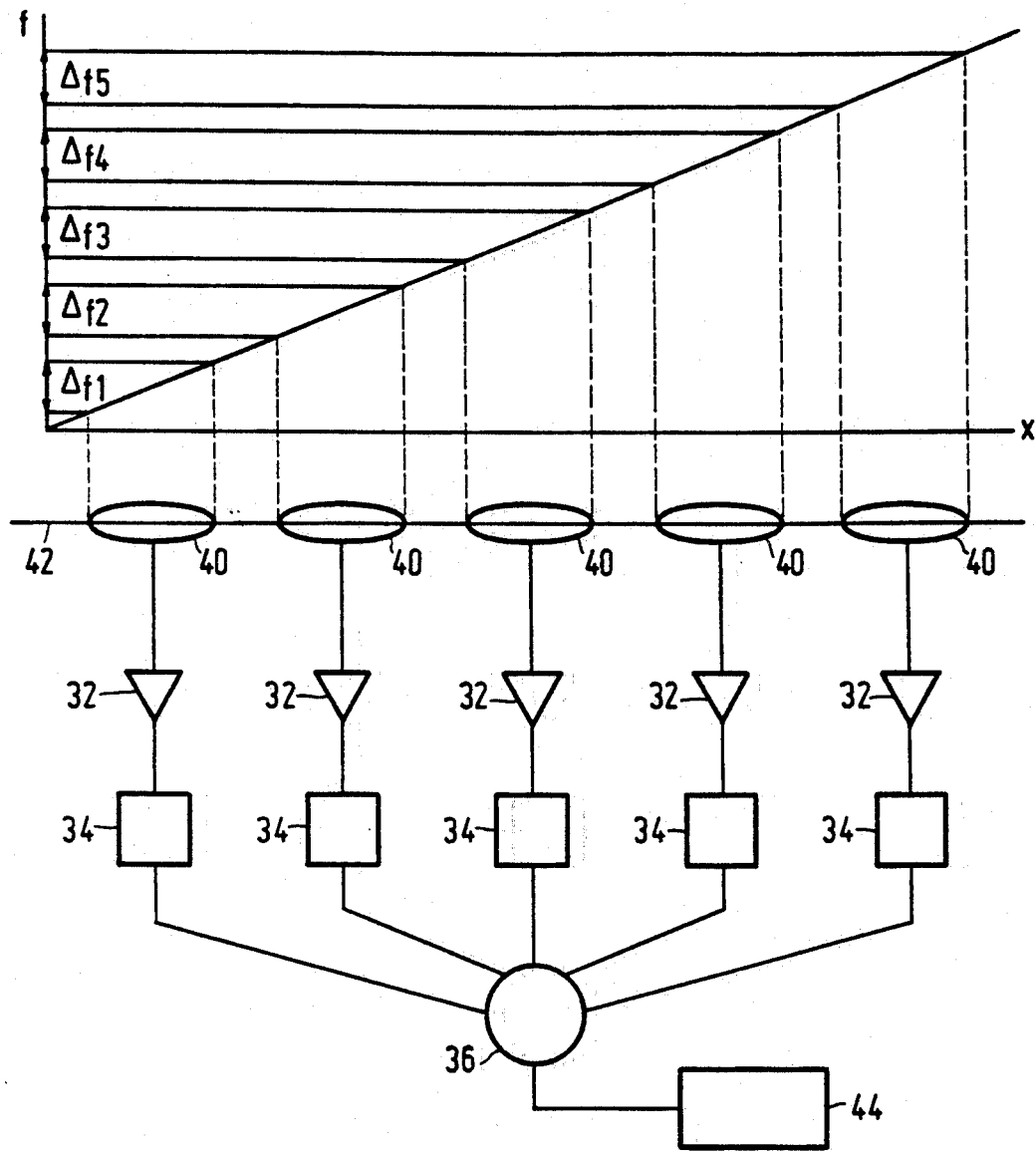
FIG. 2 shows a circuit diagram of an appropriate signal detection circuit.

The circuit diagram of FIG. 2 shows a linear coil system 31 comprising five coils 40. The coils 40 are preferably surface coils which can be arranged in the described manner and which are situated along a common axis 42 for optimum operation. The axis 42 extends parallel to the measurement gradient field direction in the apparatus. The measuring coils are thus accommodated in spaces in which different magnetic field strengths prevail. Therefore, even fully identical coils correspond to different frequency ranges. The bandpass filters 34 which may have adjustable frequency ranges, are optimally adapted to these frequency bands, i.e. so that the nominal frequency or the width of each filter in each case corresponds substantially to the frequencies of the associated frequency range. The decay curve of the band filters can be rather arbitrarily chosen for as long as no disturbing interaction occurs with neighboring frequency bands, so that the decay curve can be adapted to further signal processing. Frequency bands of individual bandpass filters have a width of, for example from 1 to 20 kHz and the signal transfer of a filter at the area of overlap amounts to, for example at the most approximately 70% of the maximum signal transfer. The bandpass filters are connected to the summing device 36 which may be a multiplexer whereto a signal processing device 44 is connected. This device covers a frequency range which covers the sum of the frequency bands of the bandpass filters. The overall frequency range may be equal to a customary measurement bandwidth in a magnetic resonance imaging apparatus. As a result, only minimum adaptations are required in the signal processing device. Two of such linear coil arrays may be included in a magnetic resonance imaging apparatus, the common axes thereof being oriented mutual perpendicularly. One of the coil elements, for example a central element of each of the arrays, may then be a common element. Preamplifiers of the coil arrays are then preferably connected to the gradient coil control system for activation and deactivation in dependence on the applied gradient field.

Figure 3:
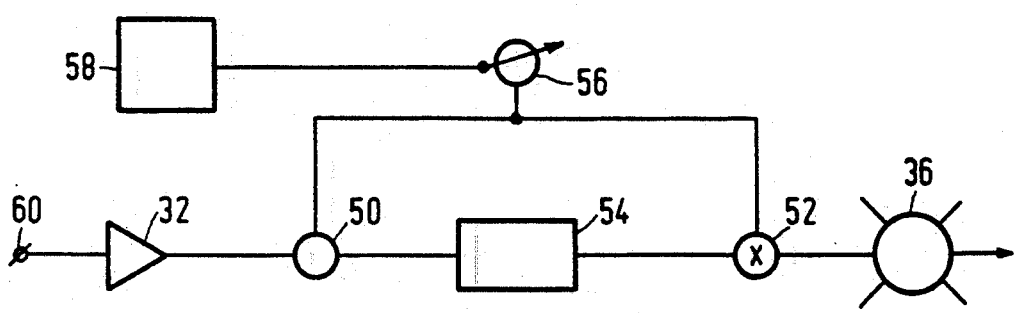
FIG. 3 shows a circuit diagram for frequency adaptation of associated bandpass filters.

FIG. 3 shows a band filter frequency adaptation circuit comprising an input mixer 50 and an output mixer 52 wherebetween a filter 54 is connected, for example a crystal filter. The input mixer 50 is connected to an input amplifier 32 and the output mixer is connected to a central signal processing device via summing device 36. An rf source 56 which may be an adjusted auxiliary oscillator is fed by a dc voltage supply 58 is also connected to the mixers 50 and 52. When a resonance signal having a frequency f IN enters via an input terminal 60 and the source 56 forms a control signal having a frequency f LO, a signal f IF to be formed by the crystal filter always satisfies f IF = f LO − f IN and a signal f UT emerging from the output mixer always satifies f UT = f LO − f IF, so f UT = f LO − (f LO − f IN) = f IN. Thus, the frequency f UT of the output signal always remains equal to that of the input signal f IN, regardless of the value of f LO. The frequency difference f IF = f LO − f IN is always maintained at a constant value because f LO varies with f IN. Thus, the filter 54 can always operate at a fixed, nominal frequency f IF.

What is claimed is:

1. A magnetic resonance imaging apparatus, comprising a magnet for generating a steady magnetic field in a measuring space, a coil system for generating a measurement gradient field, an rf coil system comprising a plurality of coil elements, and a frequency bandpass filter coupled to each coil element and adapted to a measurement frequency band of the coil element associated with that filter.

2. A magnetic resonance imaging apparatus as claimed in claim 1 wherein a selected group of coil elements are arranged in a linear array, the frequency bands of successive bandpass filters being substantially consecutive.

3. A magnetic resonance imaging apparatus as claimed in claim 2 wherein the coil elements have a longitudinal axis, said gradient field having a measurement direction, said longitudinal axis coinciding with the measurement gradient field direction.

4. A magnetic resonance imaging apparatus as claimed in claim 1, wherein the passbands of the frequency bandpass filters have a bandwidth of from approximately 1 to 20 kHz.

5. A magnetic resonance imaging apparatus as claimed in claim 1 wherein the frequency bands of the bandpass filters are adapted to frequency bands imposed by the measurement gradient field.

6. A magnetic resonance imaging apparatus as claimed in claim 1 wherein the outputs of said bandpass filters are connected to signal processing means for forming from said outputs a single combined signal to be further processed.

7. A magnetic resonance imaging apparatus as claimed in claim 6 including a signal preamplifier between each individual coil element and the associated bandpass filter.

8. A magnetic resonance imaging apparatus as claimed in claim 1 wherein the frequency of the frequency bands of the bandpass filters is adjustable.

9. A magnetic resonance imaging apparatus as claimed in claim 8 including an input mixer and an output mixer coupled to said bandpass filter for frequency adjustment, both mixers being connected to an adjustable auxiliary oscillator forming a substantially fixed difference frequency for a varying input frequency.

10. A magnetic resonance imaging apparatus as claimed in claim 9 wherein said auxiliary oscillator is controlled by a control signal which depends on the strength of the main field in the measuring space.

11. A magnetic resonance imaging apparatus as claimed in claim 3 wherein the frequency bands of the bandpass filters are adapted to frequency bands imposed by the measurement gradient field.

12. A magnetic resonance imaging apparatus as claimed in claim 11 wherein the outputs of said bandpass filters are connected to signal processing means for forming from said outputs a single combined signal to be further processed.

13. A magnetic resonance imaging apparatus as claimed in claim 12 including a signal preamplifier between each individual coil element and the associated bandpass filter.

14. A magnetic resonance imaging apparatus as claimed in claim 7 wherein the frequency of the frequency bands of the bandpass filters is adjustable.

15. A magnetic resonance imaging apparatus as claimed in claim 13 wherein the frequency of the frequency bands of the bandpass filters is adjustable.

16. A magnetic resonance imaging apparatus as claimed in claim 15 including an input mixer and an output mixer coupled to said bandpass filter for frequency adjustment, both mixers being connected to an adjustable auxiliary oscillator forming a substantially fixed difference frequency for a varying input frequency.

17. A magnetic resonance imaging apparatus as claimed in claim 16 wherein said auxiliary oscillator is controlled by a control signal which depends on the strength of the main field in the measuring space.

18. A magnetic resonance imaging apparatus as claimed in claim 5 wherein the outputs of bandpass filters are connected to signal processing means for forming from said outputs a single combined signal to be further processed.

19. A magnetic resonance imaging apparatus as claimed in claim 4 wherein the frequency bands of the bandpass filters are adapted to frequency bands imposed by the measurement gradient field.

20. A magnetic resonance imaging apparatus as claimed in claim 19 wherein the outputs of bandpass filters are connected to signal processing means for forming from said outputs a single combined signal to be further processed.

* * * * *